United States Patent
Chen

(10) Patent No.: US 8,598,715 B2
(45) Date of Patent: Dec. 3, 2013

(54) BUMP-ON-TRACE STRUCTURES IN PACKAGING

(75) Inventor: Chih-Hua Chen, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 32 days.

(21) Appl. No.: 13/310,459

(22) Filed: Dec. 2, 2011

(65) Prior Publication Data

US 2013/0140689 A1 Jun. 6, 2013

(51) Int. Cl.
*H01L 23/52* (2006.01)

(52) U.S. Cl.
USPC ..... 257/774; 257/773; 257/779; 257/E25.023

(58) Field of Classification Search
CPC .......... H01L 2924/01079; H01L 2224/13099; H01L 2924/01029
USPC ........... 257/734, 737, 774, 773, 779, E25.023
See application file for complete search history.

(56) References Cited

U.S. PATENT DOCUMENTS

| | | | |
|---|---|---|---|
| 2006/0284312 A1* | 12/2006 | Lee | 257/734 |
| 2008/0064139 A1* | 3/2008 | Bora et al. | 438/106 |
| 2012/0217632 A1* | 8/2012 | Chen et al. | 257/737 |

* cited by examiner

*Primary Examiner* — Nikolay Yushin
(74) *Attorney, Agent, or Firm* — Slater & Matsil, L.L.P.

(57) ABSTRACT

A package component includes a metal trace on a top surface of the package component, and an anchor via underlying and in contact with the metal trace. The anchor via is configured not to conduct currents flowing through the metal trace.

20 Claims, 5 Drawing Sheets

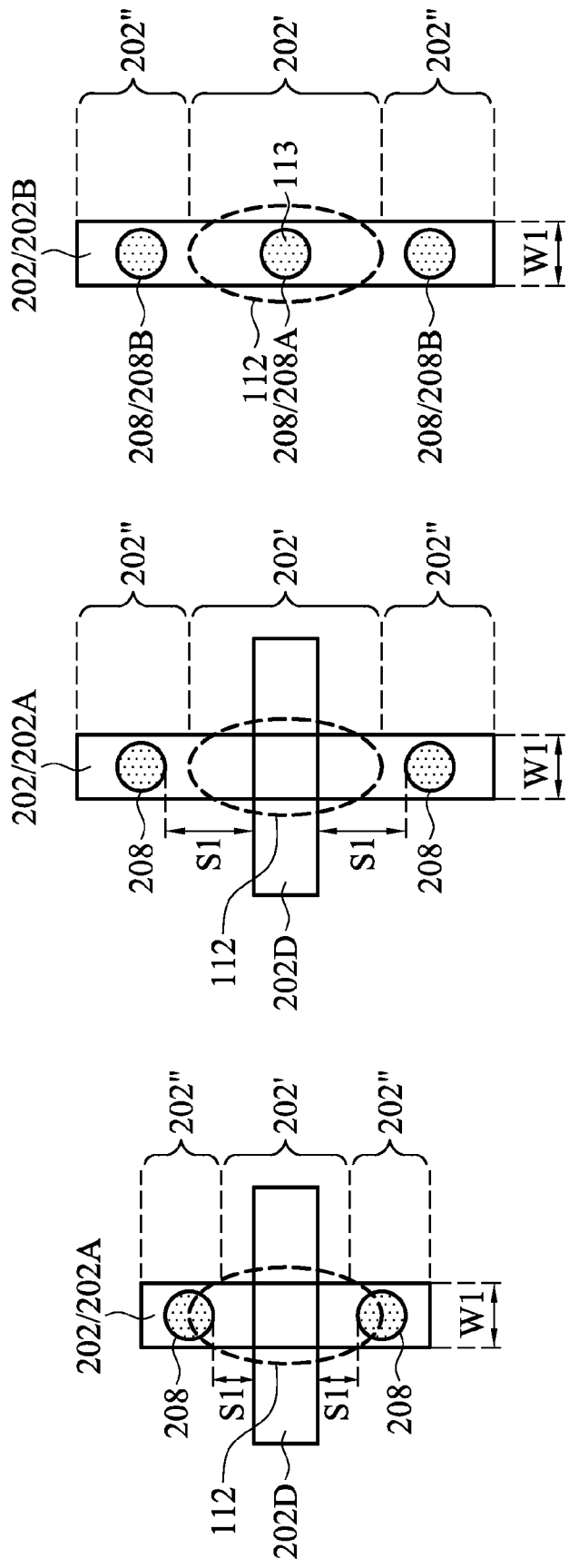

BUMP-ON-TRACE STRUCTURES IN PACKAGING

BACKGROUND

Bump-on-Trace (BOT) structures are used in flip chip packages, wherein metal bumps are bonded onto narrow metal traces in package substrates directly, rather than bonded onto metal pads that have greater widths than the respective connecting metal traces. The BOT structures require smaller chip areas, and the manufacturing cost of the BOT structures is low. The BOT structures may achieve the same reliability as the conventional bond structures that are based on metal pads.

BOT structures may sometimes suffer from peeling-off. For example, when a device die is bonded to a package substrate through the BOT structures, since there is a significant mismatch between the coefficient of thermal expansion (CTE) of the device die and the CTE of the package substrate, stress may be generated in the resulting package. The stress is applied on the metal traces in the BOT structures, causing the metal traces to peel off from the adjoining dielectric layer in the package substrate.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 5A through 5C are top views of the BOT structures in accordance with embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A package structure comprising Bump-On-Trace (BOT) structures and anchor vias is provided in accordance with various embodiments. The variations of the embodiments are discussed. Throughout the various views and illustrative embodiments, like reference numbers are used to designate like elements.

Figure 1:
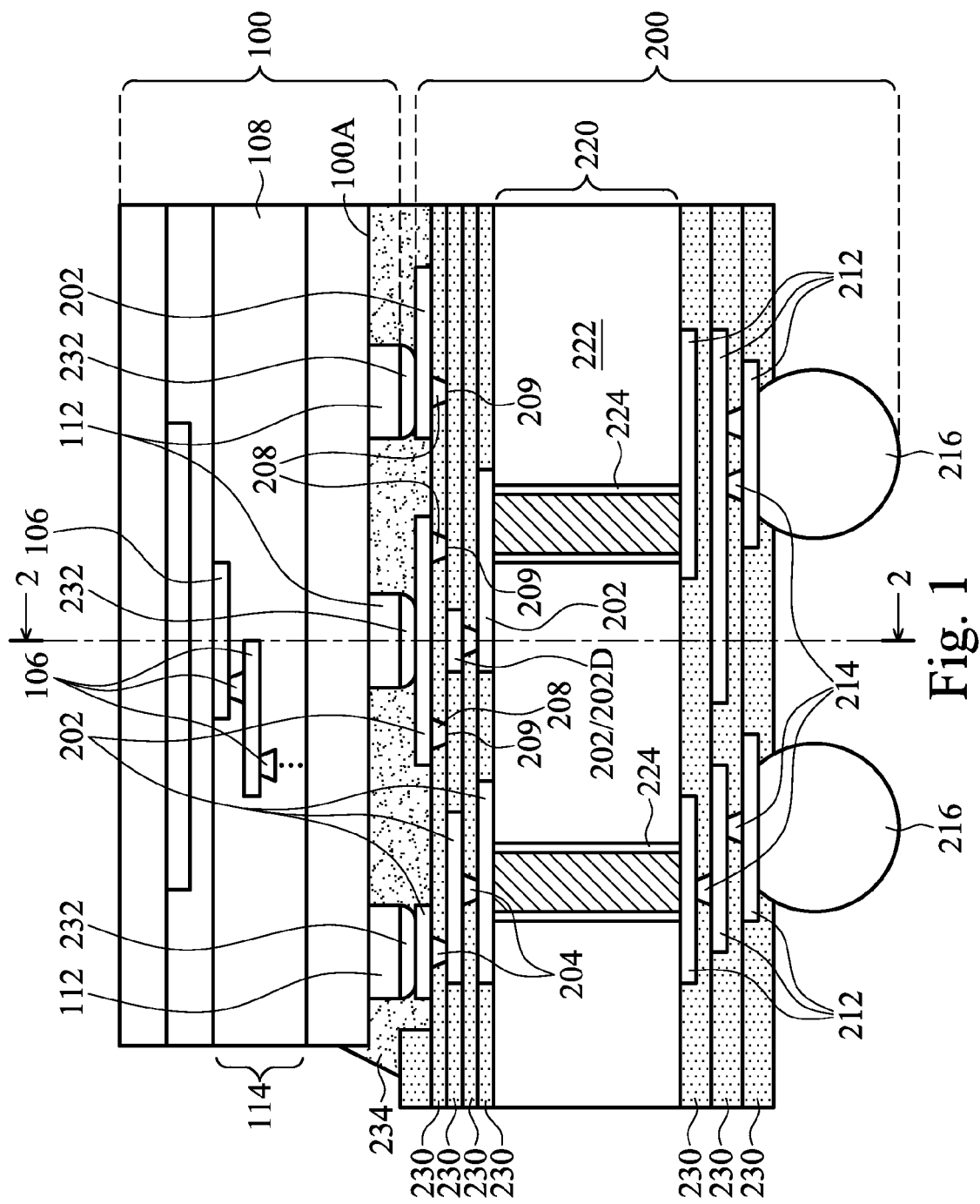
FIGS. 1 and 2 are cross-sectional views of a package comprising Bump-On-Trace (BOT) structures in accordance with embodiments, wherein anchor vias are formed under the metal traces in the BOT structures.

FIG. 1 illustrates a cross-sectional view of a package in accordance with an embodiment. The package includes package component 100 bonded to package component 200. Package component 100 may be a device die that includes active devices such as transistors (schematically illustrated as 104) therein, although package component 100 may also be other type of package components. For example, package component 100 may be an interposer that does not have active devices therein. In an embodiment wherein package component 100 is a device die, substrate 102 may be a semiconductor substrate such as a silicon substrate, although it may include other semiconductor materials. Interconnect structure 114, which includes metal lines and vias 106 formed therein and connected to the semiconductor devices, is formed to electrically couple to active devices 104. Metal lines and vias 106 may be formed of copper or copper alloys, and may be formed using damascene processes. Interconnect structure 114 may include a commonly known inter-layer dielectric (ILD, not shown) and inter-metal dielectrics (IMDs) 108. IMDs 108 may comprise low-k dielectric materials, and may have dielectric constants (k values) lower than about 3.0. The low-k dielectric materials may also be extreme low-k dielectric materials that have k values lower than about 2.5. Package component 100 may further include metal pillars 112 at its surface. Metal pillars 112 may also extend beyond surface 100A of package component 100. Metal pillars 112 may be formed of copper or a copper alloy, and may also include other layers (not shown) such as a nickel layer, a palladium layer, a gold layer, or the like.

Package component 200 may be a package substrate, although it may be another type of package components such as an interposer, for example. Package component 200 may include metal lines 202/212 and vias 204/214 for interconnecting metal features on opposite sides of package component 200. Metal lines 202 are also referred to as metal traces 202 hereinafter. In an embodiment, metal traces 202, which are formed on the topside of package component 200, are electrically coupled to connectors 216, which are on the bottom side of package component 200. The interconnection may be made through electrical connectors 224. In an exemplary embodiment, package component 200 includes core 220 comprising dielectric substrate 222 and electrical connectors 224 penetrating through dielectric substrate 222. In an exemplary embodiment, dielectric substrate 222 is formed of glass fiber, although other dielectric materials may be used. Metal lines 202/212 and vias 204/214 may be formed in dielectric layers 230. Also, on each side of core 220, the number of metal trace layers may be more than or less than what are shown in FIG. 1. It is realized that package component 200 may have various other structures, and may include laminated layers, and may not include a core.

Package components 100 and 200 are bonded to each other through solder regions 232, which may be formed of a lead-free solder, a eutectic solder, or the like. Solder regions 232 are bonded to, and are in physical contact with, the top surfaces of metal traces 202, wherein the top surfaces face package component 100.

Figure 2:
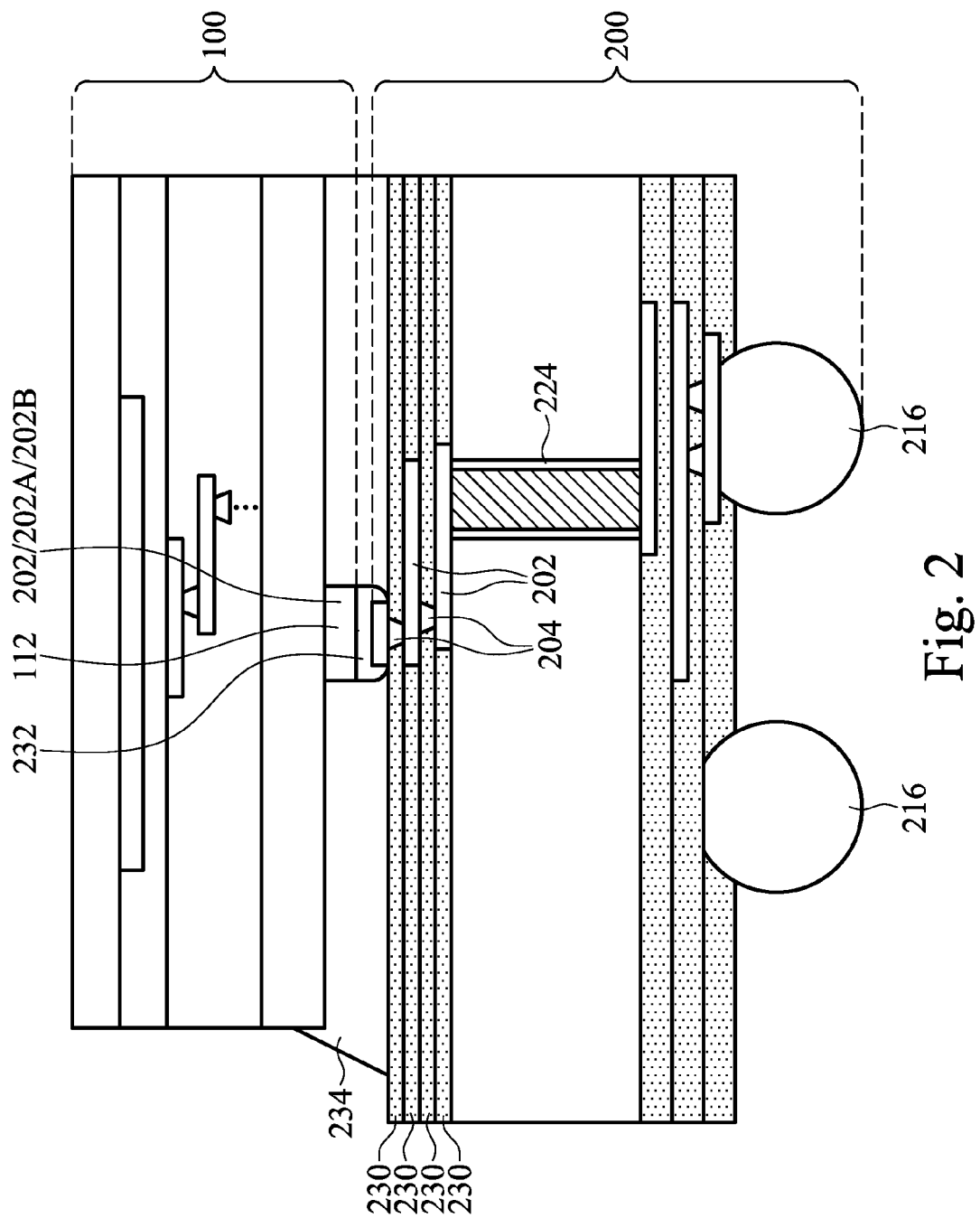

FIG. 2 schematically illustrates a cross-sectional view of one of metal traces 202 and the adjoining solder region 232, wherein the exemplary cross-sectional view is obtained from the plane crossing line 2-2 in FIG. 1. As shown in FIG. 2, solder region(s) 232 may also contact the sidewalls of the respective metal traces 202. The resulting bonding is referred to as a BOT bonding, and the resulting bond structure is referred to as a BOT structure.

Referring back to FIG. 1, after the bonding of package components 100 and 200, underfill (or a mold underfill (MUF)) 234 may be filled into the space between package components 100 and 200. Accordingly, underfill 234 is also filled into the space between neighboring metal traces 202. Underfill 234 may contact the top surfaces and the sidewalls of metal traces 202, and may contact solder regions 232. Alternatively, no underfill is filled, while the spaces between package components 100 and 200 and the space between neighboring metal traces 202 are air-gaps.

Figure 3:
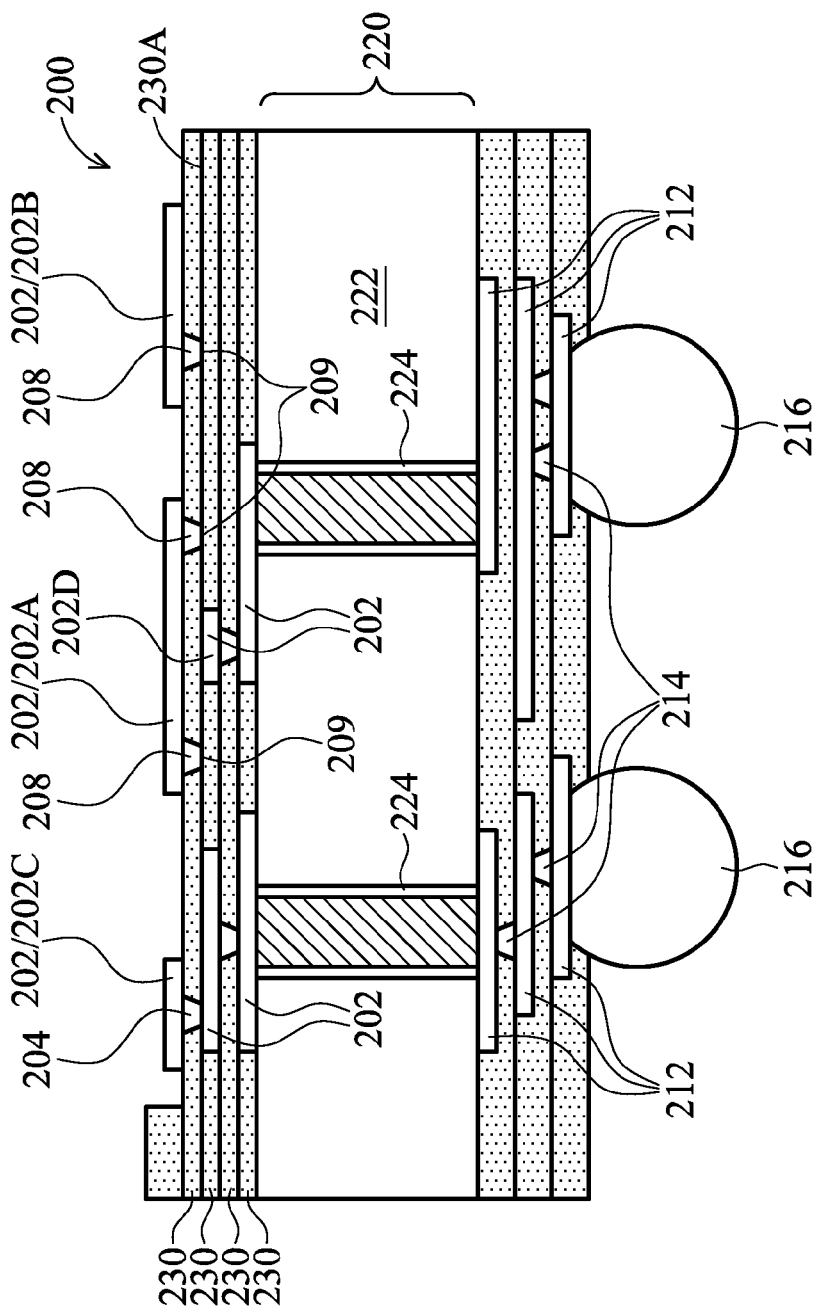
FIG. 3 illustrates a package component in accordance with embodiments, which is bonded to another package component to form the package shown in FIG. 1.

FIG. 3 illustrates a cross-sectional view of package component 200 before it is bonded to package component 100 to form the package in FIG. 1. Metal traces 202 (denoted as 202A, 202B, and 202C) are exposed on the surface of package component 200. Via 204 that is immediately underlying and electrically connected to metal trace 202C is a normal via that is used for conducting currents to and/or from metal trace 202. Metal traces 202A and 202B are also connected to vias 204 (not shown in FIG. 3, please refer to FIG. 2), which are immediately under metal traces 202A and 202B, and electrically connect metal traces 202A and 202B to the electrical connectors 224 and/or 216. Since the vias 204 that are immediately underlying metal traces 202A and 202B are not in the plane shown in FIG. 3, vias 204 are not illustrated in FIG. 3.

Again refer to FIG. 3, anchor vias 208 are formed under metal traces 202A and 202B. The top surfaces of anchor vias 208 may be in physical contact with the bottom surfaces of the respective overlying metal traces 202A and 202B. Anchor vias 208 may be formed of the same material, and may be formed in the same process steps, as vias 204 that are immediately under metal trace 202C. In some embodiments, the bottom surfaces 209 of anchor vias 208 are in contact with top surface 230A of one of dielectric layer 230, and there are no conductive features such as metal traces underlying and in physical contact with anchor vias 208. When the package as in FIG. 1 (which includes package component 200 as shown in FIG. 3) is powered up during its usage, anchor vias 208 may have the same voltage as the respective connecting metal traces 202A and 202B, However, no current flows through any of anchor vias 208, although metal traces 202A and 202B may have currents.

Figure 4:
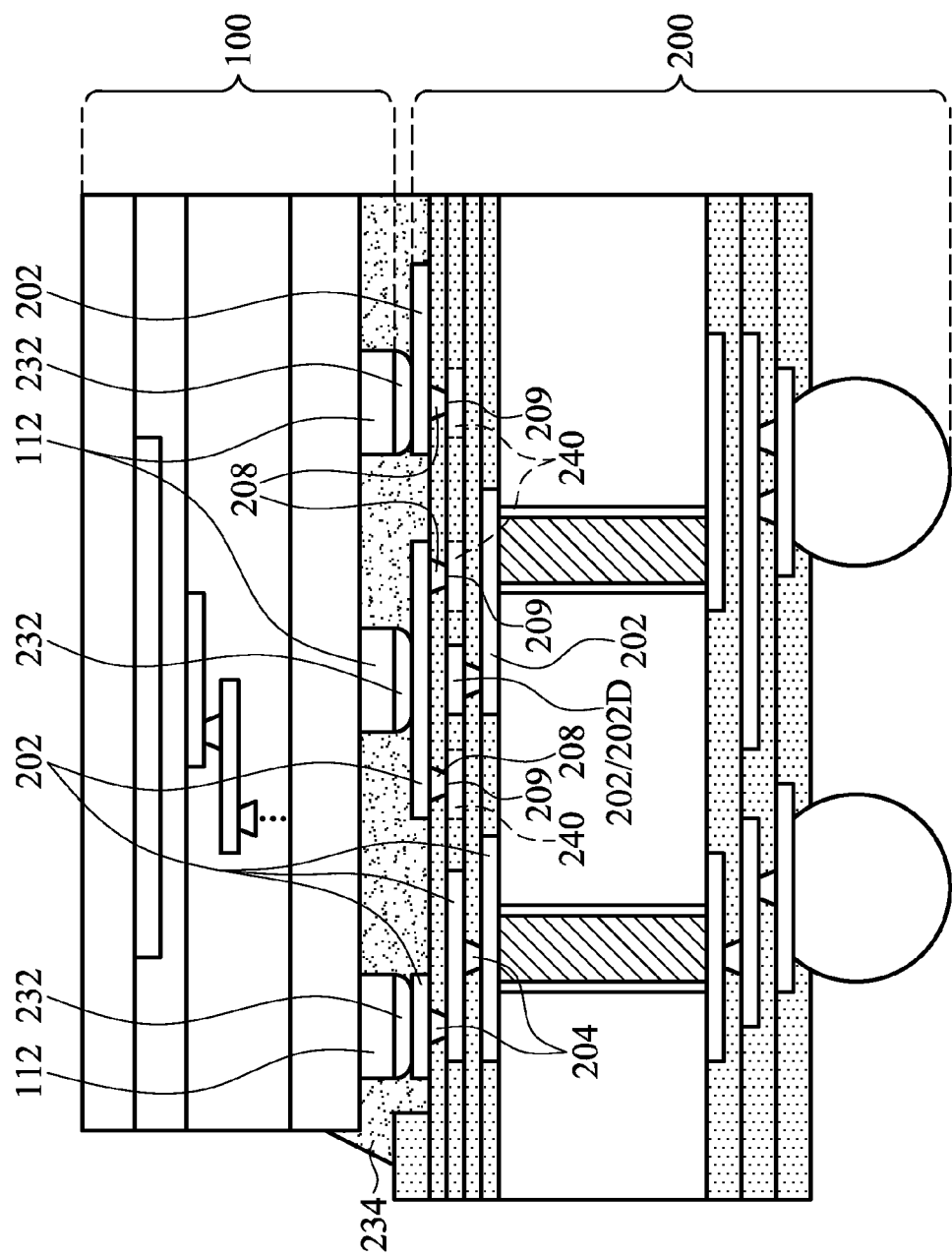
FIG. 4 illustrates a cross-sectional view of a package comprising BOT structures in accordance with embodiments, wherein a anchor pad is formed underlying an anchor via.

FIG. 4 illustrates alternative embodiments. Unless specified otherwise, the materials and formation methods of the components in these embodiments are essentially the same as the like components, which are denoted by like reference numerals in the embodiment shown in FIGS. 1 through 3. In these embodiments, anchor metal traces or pads (which have greater widths than metal traces) 240 are formed under anchor vias 208. Bottom surfaces 209 of anchor vias 208 may be in contact with the top surfaces of anchor traces or pads 240. In these embodiments, however, metal traces or pads 240 are used for improving the anchoring of metal trace 202, and are not used for conducting currents flowing through metal traces 202. Accordingly metal traces/pads 240 may not have any underlying conductive features connected to them. When the package as in FIG. 4 is powered up during its usage, anchor traces/pads 240 may have the same voltage as the respective connecting metal traces 202A and 202B, However, no current flows through any of anchor traces/pads 240.

FIGS. 5A through 5C illustrate various top views. FIG. 5A illustrates a top view of a portion of the structure in FIG. 3, wherein metal trace 202A and the respective underlying anchor vias 208 are illustrated. In addition, metal pillar 112 is also illustrated. In these embodiments, metal trace 202D (please also refer to FIGS. 1, 3, and 4) is directly under metal trace 202A and in the metal trace layer that is immediately under the metal trace layer of metal trace 202A. Anchor vias 208 may be formed on one side, or on both sides, of metal trace 202D. Anchor vias 208 are adjacent to metal trace 202D and the overlying metal pillar 112. For example, distance S1 between anchor vias 208 and metal trace 202D may be smaller than about 15 µm, or smaller than about 10 µm, unless the design rules require that distance S1 to be greater. In which case, distance S1 may be equal to or slightly greater than the minimum distance allowed by the design rules. Depending on the size of metal pillar 112, in the top view, parts of anchor vias 208 may overlap metal pillar 112. Alternatively, entireties of anchor vias 208 may overlap metal pillar 112. Alternatively stated, parts of, or entireties of, anchor vias 208 may be vertically aligned to metal pillar 112. In yet other embodiments, as shown in FIG. 5B, anchor vias 208 may not overlap any portion of metal pillar 112. However, anchor vias 208 may still be adjacent to metal pillar 112 and metal trace 202D, with distance S1 being smaller than about 15 µm, smaller than about 10 µm, or close to the minimum distance allowed by the design rules.

FIG. 5C illustrates a top view of a portion of the structure in FIGS. 1 through 4, wherein metal trace 202B and the respective connecting anchor via(s) 208 are illustrated. In these embodiments, one or more anchor via 208 may be directly underlying (as shown in FIG. 3), and is aligned to the respective metal pillar 112 that is electrically connected to metal trace 202B. One or more of anchor vias 208 may be substantially aligned to the center 113 of metal pillar 112. In some embodiments, anchor via 208A is directly underlying (as shown in FIG. 3) and connected to metal trace 202B. Optionally, one or more anchor vias 208B may be added in addition to the anchor via 208A, wherein anchor vias 208B are not aligned to center 113 of metal pillar 112. In yet other embodiments, anchor via(s) 208B are formed, while anchor via 208A is not formed, even though no metal trace 202D that is similar to what is shown in FIG. 4A is formed.

In the BOT structures as shown in FIGS. 5A through 5C, metal trace 202 may include first portion covered by metal pillar 112 and solder region 232 (FIGS. 1 through 4), and a second portion adjacent to the first portion, wherein the second portion is not covered by metal pillar 112 and solder region 232. For example, FIGS. 5A through 5C illustrate the exemplary first portions 202' and second portions 202" that joins the respective first portion 202'. First portions 202' may have the same width W1 as second portions 202". In alternative embodiments, first portions 202' and the respective connecting second portions 202" may have different widths.

By forming anchor vias, the adhesion force between anchor vias 208 is added to the adhesion force between metal traces 202 and the underlying dielectric layers 230. Therefore, the adhesion of metal traces 202 to the underlying dielectric layers 230 is improved, and the metal trace peeling may be reduced.

In accordance with embodiments, a package component includes a metal trace on a top surface of the package component. An anchor via is disposed underlying and in contact with the metal trace. The anchor via is configured not to conduct currents flowing through the metal trace.

In accordance with other embodiments, a device includes a package component. A metal trace is disposed on a surface of the package component. A BOT structure includes a metal pillar, and a solder region bonding the metal pillar to a portion of the metal trace. An anchor via is underlying and in contact with the metal trace. The anchor via is configured not to conduct currents flowing through the metal trace. The anchor via is adjacent to the solder region, and may have a bottom surface contacting a dielectric layer.

In accordance with yet other embodiments, a package includes a package substrate bonded to a device die. The package substrate includes a dielectric layer, a metal trace on a top surface of the package substrate and overlying the dielectric layer, and an anchor via underlying the metal trace. The anchor via includes a top surface in contact with the metal trace, and a bottom surface in contact with a top surface of the dielectric layer. The device die includes a metal pillar. A solder region bonds the metal pillar to a portion of the metal trace. The solder region is in contact with a top surface and sidewalls of the metal trace.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a first package component comprising:
      a first metal trace on a top surface of the first package component; and
      a first anchor via underlying and in contact with the first metal trace, wherein the first anchor via is configured not to conduct currents flowing through the first metal trace; and
   a solder region in contact with a top surface and sidewalls of the first metal trace, wherein the solder region is adjacent to the first anchor via.

2. The device of claim 1 further comprising:
   a first dielectric layer underlying the first metal trace, wherein the first anchor via extends into the first dielectric layer; and
   a second dielectric layer underlying the first dielectric layer, wherein a bottom surface of the first anchor via is in contact with a top surface of the second dielectric layer.

3. The device of claim 2, wherein an entirety of the bottom surface of the first anchor via is in physical contact with the top surface of the second dielectric layer.

4. The device of claim 1 further comprising:
   a dielectric layer underlying the first metal trace, wherein the first anchor via extends into the dielectric layer; and
   an anchor metal feature underlying and in contact with a bottom surface of the first anchor via, wherein the anchor metal feature is configured not to conduct the currents flowing through the first metal trace.

5. The device of claim 1 further comprising a second anchor via adjacent to the first anchor via, wherein the second anchor via is underlying and in contact with the first metal trace, and wherein the second anchor via is configured not to conduct the currents flowing through the first metal trace.

6. The device of claim 5 further comprising a second metal trace underlying the first metal trace and horizontally between the first anchor via and the second anchor via, wherein the second metal trace is in a metal trace layer immediately underlying a metal trace layer of the first metal trace.

7. The device of claim 1 further comprising a second package component, wherein the second package component comprises a metal pillar bonded to the first metal trace through the solder region.

8. The device of claim 7, wherein the first package component is a package substrate, and the second package component is a device die.

9. A device comprising:
   a first package component;
   a first metal trace on a surface of the first package component;
   a first Bump-on-Trace (BOT) structure comprising:
      a metal pillar; and
      a solder region bonding the metal pillar to a portion of the first metal trace;
   a first anchor via underlying and in contact with the first metal trace, wherein the first anchor via is configured not to conduct currents flowing through the first metal trace, and wherein the first anchor via is adjacent to the solder region; and
   a dielectric layer underlying the first anchor via, wherein a bottom surface of the first anchor via is in physical contact with a top surface of the dielectric layer.

10. The device of claim 9, wherein the first anchor via is substantially aligned to the solder region.

11. The device of claim 9 further comprising a second anchor via underlying and in contact with the first metal trace, wherein the second anchor via is configured not to conduct currents flowing through the first metal trace, and wherein the second anchor via is adjacent to the solder region.

12. The device of claim 11 further comprising a second metal trace underlying the first metal trace and horizontally between the first anchor via and the second anchor via, wherein the second metal trace is in a metal trace layer immediately underlying a metal trace layer of the first metal trace.

13. The device of claim 9 further comprising a second package component, wherein the second package component comprises the metal pillar at a surface of the second package component.

14. The device of claim 13, wherein the first package component is a package substrate, and the second package component is a device die.

15. A device comprising:
   a package substrate comprising:
      a dielectric layer;
      a first metal trace on a top surface of the package substrate and overlying the dielectric layer; and
      a first anchor via underlying the first metal trace, wherein the first anchor via comprises a top surface in contact with the first metal trace, and a bottom surface in contact with a top surface of the dielectric layer;
   a device die comprising a first metal pillar; and
   a first solder region bonding the first metal pillar to a portion of the first metal trace, wherein the first solder region is in contact with a top surface and sidewalls of the first metal trace.

16. The device of claim 15, wherein the first anchor via is aligned to the first metal pillar.

17. The device of claim 16 further comprising:
   a second metal trace on the top surface of the package substrate and over the dielectric layer; and
   a second anchor via underlying the second metal trace, wherein the second anchor via comprises a top surface in contact with the second metal trace, and a bottom surface in contact with the top surface of the dielectric layer, and wherein the device die comprises:
      a second metal pillar; and
      a second solder region bonding the second metal pillar to a portion of the second metal trace, wherein the second solder region is in contact with a top surface and sidewalls of the second metal trace, and wherein the second anchor via is misaligned to the second metal pillar.

18. The device of claim 15 further comprising a second anchor via underlying the first metal trace, wherein the second anchor via comprises a top surface in contact with the first metal trace, and a bottom surface in contact with the top surface of the dielectric layer, and wherein the second anchor via is adjacent to the first anchor via.

19. The device of claim 15, wherein the first metal trace comprises a first portion and a second portion joining the first portion, and wherein the first solder region is in contact with the sidewalls of the first portion of the first metal trace, and is not in contact with sidewalls of the second portion of the first metal trace, and wherein the first portion and the second portion have substantially a same width.

20. The device of claim 15, wherein an entirety of the bottom surface of the first anchor is in physical contact with the top surface of the dielectric layer.

* * * * *